US009715905B2

(12) United States Patent
Aipperspach et al.

(10) Patent No.: US 9,715,905 B2

(45) Date of Patent: Jul. 25, 2017

(54) DETECTING MAXIMUM VOLTAGE BETWEEN MULTIPLE POWER SUPPLIES FOR MEMORY TESTING

(71) Applicant: International Business Machines Corporation, Armonk, NY (US)

(72) Inventors: Anthony G. Aipperspach, Minnesota, MN (US); Derick G. Behrends, Rochester, MN (US); Todd A. Christensen, Rochester, MN (US); Jeffrey M. Scherer, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/824,433

(22) Filed: Aug. 12, 2015

(65) Prior Publication Data

US 2017/0047099 A1 Feb. 16, 2017

(51) Int. Cl.

*G11C 7/00* (2006.01)
*G11C 5/14* (2006.01)
*G11C 11/4074* (2006.01)

(52) U.S. Cl.

CPC ................ *G11C 5/14* (2013.01); *G11C 5/147* (2013.01); *G11C 11/4074* (2013.01)

(58) Field of Classification Search

CPC ........ G11C 5/147; G11C 5/14; G11C 11/4074
USPC ....................... 365/226, 189.11, 189.09, 228
See application file for complete search history.

(56) References Cited

U.S. PATENT DOCUMENTS 4,814,638 A 3/1989 Weick
5,841,706 A * 11/1998 Umezaki ................ G11C 5/143 365/189.09
5,909,402 A 6/1999 Joo
6,028,449 A 2/2000 Schmitt
6,031,779 A * 2/2000 Takahashi ................ G11C 7/06 365/189.09
6,563,744 B2 5/2003 Kuroki
6,853,593 B1 * 2/2005 Bae .......................... G11C 7/06 365/189.09
7,030,635 B2 4/2006 Hong
7,193,425 B2 3/2007 Isobe
7,580,306 B2 * 8/2009 Cho ....................... G11C 7/065 365/189.09
7,729,173 B2 6/2010 Kim
8,154,275 B2 4/2012 Jain (Continued)

FOREIGN PATENT DOCUMENTS

CN 103995169 A 8/2014
CN 104237661 A 12/2014

*Primary Examiner* — Connie Yoha

(74) *Attorney, Agent, or Firm* — Patterson + Sheridan, LLP

(57) ABSTRACT

A computing system, processing unit, and method are disclosed for detecting a maximum voltage power supply for performing memory testing. The method includes generating, using a sense amplifier of a processing unit and based on a timing of a received pulse signal, first and second drive signals that collectively indicate which of first and second voltages is greater, the first and second voltages produced by respective first and second power supplies. The method also includes coupling, based on the first and second drive signals, the power supply corresponding to the relatively greater voltage of the first and second voltages with the memory.

20 Claims, 7 Drawing Sheets

500 225 VMAX P7 P9 P8 P10 VD P15 505 N5 530 510 N6 VC P16 VD_DRIVE VMAX VC_DRIVE P11 P13 VMAX P12 P14 515 N7 535 520 N8

(56) References Cited

U.S. PATENT DOCUMENTS

| | | | | |
|---|---|---|---|---|
| 2007/0070711 | A1* | 3/2007 | Kim | G11C 7/06<br>365/189.16 |
| 2013/0307590 | A1* | 11/2013 | Baek | H03K 3/00<br>327/108 |

* cited by examiner

DETECTING MAXIMUM VOLTAGE BETWEEN MULTIPLE POWER SUPPLIES FOR MEMORY TESTING

BACKGROUND

The present disclosure relates to memory testing, and more specifically, to techniques for detecting a maximum voltage power supply for performing memory testing.

It can be beneficial to test a memory device by operating the memory at different voltage levels. Operating the memory device at larger voltage levels can be used to determine suitable operating ranges for the memory device, and may assist in the detection of defects in the memory device that may not manifest at lower voltage levels. Often, the output voltage of memory testing circuitry is limited by a substantial threshold voltage drop.

SUMMARY

According to one embodiment of the present disclosure, a computing system is disclosed that includes a memory, and a processing unit configured to perform testing of the memory using a selected one of at least first and second power supplies producing respective first and second voltages. The processing unit includes a sense amplifier module configured to generate first and second drive signals corresponding to the respective first and second power supplies and indicating which of the first and second voltages is greater, and a voltage drive module configured to receive the first and second drive signals and to drive the relatively greater voltage of the first and second voltages onto an output coupled with the memory.

According to another embodiment, a processing unit is disclosed that is configured to receive first and second voltages from respective first and second power supplies, and to drive a relatively greater voltage of the first and second voltages onto an output coupled with a memory. The processing unit includes a sense amplifier module configured to generate first and second drive signals corresponding to the respective first and second power supplies and indicating which of the first and second voltages is greater, and a voltage drive module configured to receive the first and second drive signals and to drive the relatively greater voltage of the first and second voltages onto the output.

According to another embodiment, a method of operating a processing unit to perform testing of a coupled memory is disclosed, the processing unit further coupled with first and second power supplies producing respective first and second voltages. The method includes generating, using a sense amplifier of the processing unit and based on a timing of a received pulse signal, first and second drive signals that collectively indicate which of the first and second voltages is greater. The method further includes coupling, based on the first and second drive signals, the power supply corresponding to the relatively greater voltage of the first and second voltages with the memory.

Figure 1:
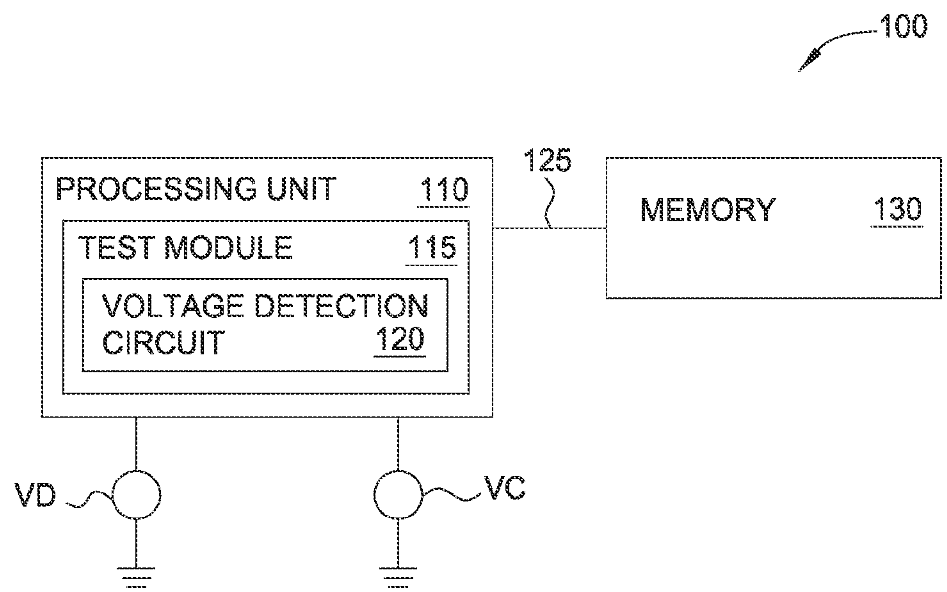
FIG. 1 is a block diagram of an exemplary computing system, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The illustrations referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments are generally directed to a computing system, processing unit, and method used to perform testing of a coupled memory device using a selected power supply from a plurality of power supplies providing respective voltage levels. Providing the relatively largest voltage level to a memory device can increase the ability to determine suitable operating ranges for the memory device and/or to detect defects in the memory device. According to techniques discussed herein, the largest voltage level may be provided to the memory without having the voltage level being affected by a threshold voltage drop. In some cases, a threshold voltage drop can represent a substantial reduction of the output voltage level, and a memory device coupled with previous voltage detection circuitry may be unable to be tested at the full power supply voltage. Additionally, according to techniques discussed herein, the largest voltage level between two power supplies can be determined without creating any DC current flowing between the power supplies, resulting in power conservation and improved circuit performance. Furthermore, according to techniques discussed herein, the voltage source providing the largest voltage level is operated at or close to a "fully on" state (e.g., within a saturation region for a transistor). When compared with previous approaches, in which the voltage source is operated closer to the cut-off region (e.g., near a threshold voltage of the transistor), operating the voltage source at a "fully on" state results in a much lower impedance and improved responsiveness to any changes in current demands.

FIG. 1 is a block diagram of an exemplary computing system, according to embodiments described herein. Computing system 100 includes a processing unit 110 communicatively coupled with a memory 130 through connection (s) 125. The computing system 100 may be implemented in any suitable form, such as a general purpose computer, a special purpose computer, or other programmable data processing apparatus. The processing unit 110 may have any suitable form, such as a general purpose microprocessor, controller, application-specific integrated circuit (ASIC), or other suitable logic circuitry. The processing unit 110 may be coupled with a plurality of different power supplies, which may be used for operating various components of the processing unit 110 and/or of the greater computing system 100. For example, the computing system 100 may include separate power supplies for the transistors or other logic elements included in the processing unit 110, and for memory elements coupled with the processing unit 110. A number of other power supplies may also be included. The processing unit 110 includes a test module 115 configured to perform testing of the memory 130. In some embodiments, the test module 115 is used as part of mixed-mode testing of the memory 130. Memory 130 may include a variety of computer-readable media selected for their size, relative performance, or other capabilities: volatile and/or non-volatile media, removable and/or non-removable media, etc. Memory 130 may have any suitable form, such as registers, cache, random access memory (RAM), Flash memory, storage, etc. In some embodiments, memory 130 represents a volatile memory of the computing system 100, such as processor registers and/or static or dynamic RAM.

The test module 115 includes a voltage detection circuit 120 configured to drive a selected power signal to the memory 130. As shown with power supplies VC and VD, the voltage detection circuit 120 determines the greater voltage of VC and VD and provides this voltage to the memory 130 through connection(s) 125. The connection(s) 125 generally include one or more conductive paths suitable for communicatively coupling the processing unit 110 with the memory 130. The connection(s) 125 may have any form, such as traces on a printed circuit board (PCB), wires, etc. While the connection(s) 125 is configured to provide a selected power signal to the memory 130, other of the connection(s) may support data communications between the processing unit 110 and memory 130.

Generally, it can be beneficial to test the memory 130 by operating the memory 130 at different voltage levels. Specifically, operating the memory 130 at a relatively larger voltage level provides a greater ability to determine suitable operating ranges for memory 130 and/or to detect defects in the memory 130. In some embodiments, the test module 115 is further configured to vary other parameters for testing memory 130, such as temperature, refresh rates, etc.

Figure 2:
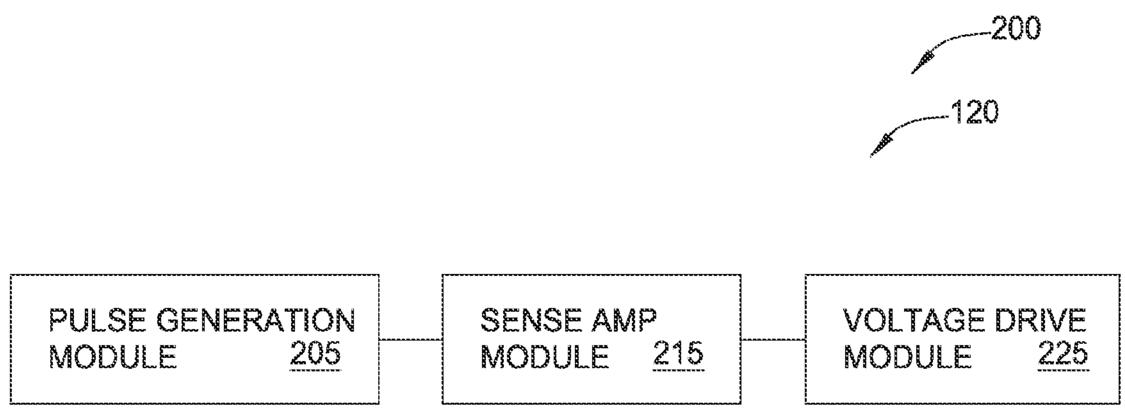
FIG. 2 is a block diagram of an exemplary voltage detection circuit, according to embodiments described herein.

FIG. 2 is a block diagram of an exemplary voltage detection circuit, according to embodiments described herein. The voltage detection circuit 200 provides one particular implementation of the voltage detection circuit 120 discussed above. While generally discussed with the simplest case of two power supplies, other embodiments of the voltage detection circuit 200 may be configured to receive three or more power supplies, selecting the greatest voltage of the three or more power supplies and delivering the same to a coupled memory. Moreover, while discussed primarily with regard to a test module for a memory (e.g., test module 115 and memory 130), the person of ordinary skill will recognize that the voltage detection circuit 200 is suitable for use in other contexts where determining a maximum voltage is required between two or more power supplies or other voltages.

The voltage detection circuit 200 includes a pulse generation module 205, a sense amplifier module (sense amp module) 215, and a voltage drive module 225. The pulse generation module 205 is generally configured to receive an input signal and to output a pulse signal. The characteristics of the pulse signal, such as timing of rising edge and/or falling edge, pulse width, duty cycle, amplitude, etc. may be controlled based on the received input signal. The sense amplifier module 215 is generally configured to receive the pulse signal from the pulse generation module 205 and to generate drive signals that collectively indicate which of the power supplies has a higher voltage. In some embodiments, one of the drive signals corresponding to the greater voltage power supply corresponds to a first logic level (e.g., a logical "high"), and the other of the drive signals corresponds to a second logic level (e.g., a logical "low").

In alternate embodiments, the components of the voltage detection circuit 200 may vary. In some cases, the voltage detection circuit 200 may include greater or fewer modules. For example, multiple sense amp modules 215 could be used in the case of three or more power supplies. In another example, the input signal to the voltage detection circuit 200 may already have a suitable form for controlling the sense amp module(s) 215, such that the pulse generation module 205 is not needed.

As will be seen in the description of various components of the voltage detection circuit 200, the voltage detection circuit 200 offers several benefits over previous implementations of voltage detection circuitry. First, the voltage detection circuit 200 operates to output the larger of the power supply voltages without the output voltage level being affected by a threshold voltage drop. The threshold voltage drop may generally be on the order of several hundred millivolts, which causes the output voltage level to not fully reflect the power supply voltage. Accordingly, a memory coupled with previous voltage detection circuitry may be unable to be tested at the full power supply voltage. Next, the voltage detection circuit 200 operates to detect a greater voltage between two power supplies without creating any DC current between the power supplies. No DC current helps the voltage detection circuit 200 to conserve power, and generally provides better circuit performance as DC current tends to increase temperature and degrade performance.

Figure 3:
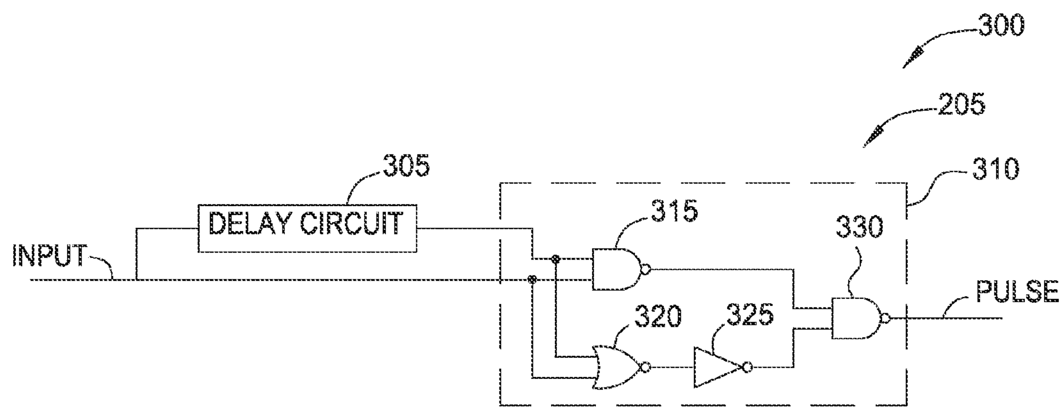
FIG. 3 is a schematic diagram of an exemplary pulse generation module, according to one embodiment.

FIG. 3 is a schematic diagram of an exemplary pulse generation module, according to one embodiment. The pulse generation module 300 represents one possible implementation of pulse generation module 205 discussed above. The pulse generation module receives an input signal "INPUT" and logic configured to generate a suitable pulse signal "PULSE" that is based on the input signal. As shown, the input signal is provided in parallel to a delay circuit 305 and to circuitry 310. As shown, circuitry 310 includes a plurality of logic gates, such as a NAND gate 315, NOR gate 320, NOT gate 325, and NAND gate 330. Alternatively, circuitry 310 could be represented as an exclusive-OR (XOR) gate. The circuitry 310 receives the input signal and a delayed input signal from the delay circuit 305, and generates the pulse signal. Generally, the delay circuit 305 receives the input signal and provides the delayed input signal to control the width of the pulse signal being transmitted to connected circuitry. The delay circuit 305 may have any suitable construction, which tends to vary based on the overall circuit implementation, but in some cases the delay circuit 305 may be implemented with merely a few (e.g., three to five) daisy-chained inverters. More complex implementations of the delay circuit 305 are possible. In some cases, the construction of the delay circuit 305 is controlled based on a desired minimum pulse width. For example, say a suitable performance of the overall voltage detection circuit 120 requires the pulse generation module 300 to produce pulses having a width of at least $T_{min}$. In this example, the delay circuit 305 could be designed to produce a minimum pulse width of $T_{min}$, or could be designed alternatively to provide additional margins (i.e., a minimum pulse width greater than $T_{min}$), such as a minimum pulse width of $1.5\times T_{min}$, $2\times T_{min}$, and so forth. In some embodiments, a rising edge and a falling edge of the input signal each trigger a rising edge in the generated pulse signal. Other implementations of the pulse generation module 300 are possible for producing a suitable pulse signal. For example, in some embodiments the pulse generation module 300 may include a self-timed loop to initiate the "reset" and "set" signals for the sense amplifier 215, as an alternative to using a delay circuit 305. The self-timed loop would ensure that the pulse signal has a suitable width for the sense amplifier 215 to reset.

Figure 4:
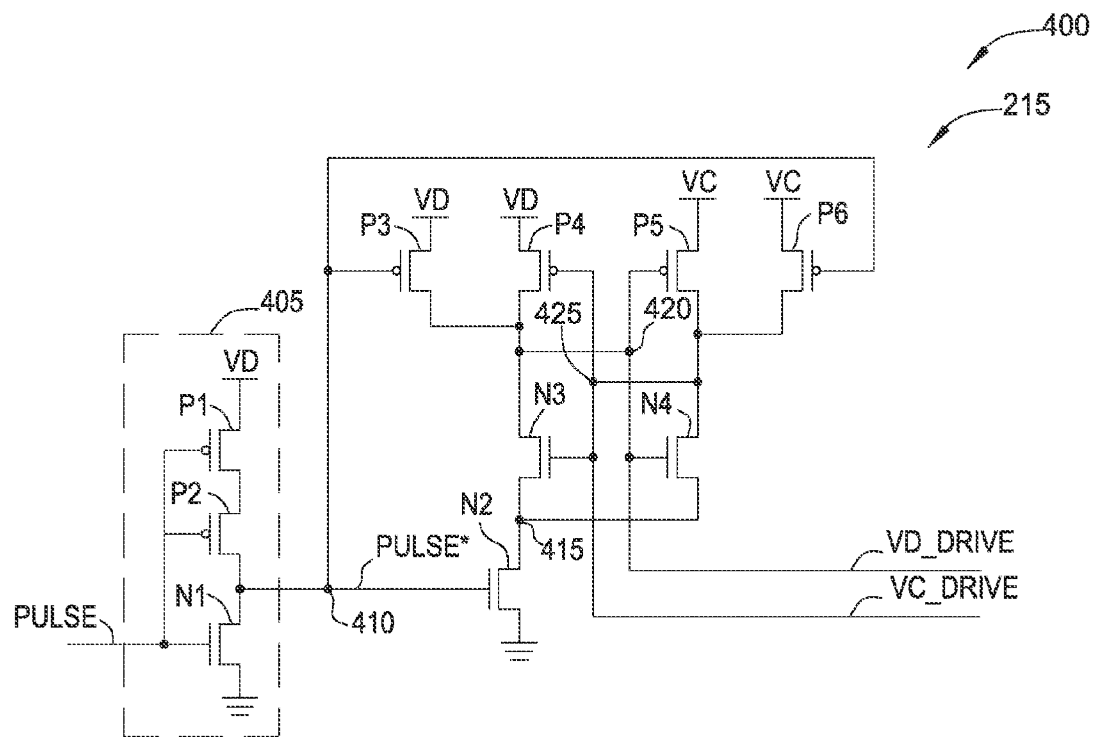
FIG. 4 is a schematic diagram of an exemplary sense amplifier module, according to one embodiment.

FIG. 4 is a schematic diagram of an exemplary sense amplifier module, according to one embodiment. The sense amplifier module 400 represents one particular implementation of the sense amplifier 215 discussed above. The sense amplifier includes an inverter 405 comprising two p-channel metal-oxide-semiconductor field-effect transistors (MOSFETs or PFETs) P1, P2, and one n-channel MOSFET (or NFET) N1. Other configurations of the inverter 405 are possible, including greater or fewer components, and may be implemented using alternative types of switching devices (e.g., diodes or other types of transistors). The inverter 405 receives an input pulse signal "PULSE" from the pulse generation module. The inverter 405 generates an inverted pulse signal "PULSE*" at node 410, which is connected with the drains of N1 and P2.

The sense amplifier module 400 also includes several other PFETs P3, P4, P5, and P6, and NFETs N2, N3, N4. The voltage sources VC, VD are selectively connected with respective output nodes 425, 420 to produce corresponding drive signals VC_DRIVE, VD_DRIVE. In other words, the voltage source VD is configured to couple through a path provided by one of P3 and P4 onto output node 420 to produce the VD_DRIVE signal. The voltage source VC is configured to couple through a path provided by one of P5 and P6 onto output node 425 to produce to VC_DRIVE signal.

The inverted pulse signal PULSE* is provided to the gates of P3, P6, and N2. In some embodiments, P3 and P6 are operated to pre-charge respective output nodes 420, 425 during certain periods. On a falling edge of PULSE* (corresponding to a rising edge of PULSE), N2 is switched off and substantially does not conduct current through its channel. P3 and P6 are switched on, conducting current through their respective channels and coupling the respective power supplies VD and VC to output nodes 420, 425. Because N2 is switched off, no path is provided to ground and the voltages of output nodes 420, 425 eventually increase to the VD and VC levels.

On a rising edge of PULSE* (corresponding to a falling edge of PULSE), P3 and P6 are switched off, disconnecting nodes 420, 425 from VD and VC. The voltage on pre-charged nodes 420, 425 is maintained temporarily. The rising edge of PULSE* also causes N2 to be switched on, coupling node 415 to ground through the channel of N2. The drains of N3 and N4 are thus coupled with ground. Nodes 420 and 425 are coupled with the respective gates of N4 and N3, and coupling node 415 to ground produces a positive gate to source voltage $V_{GS}$ for N3 and N4. The current flowing through the channels of N3 and N4 is thus controlled based on the relative voltages of the nodes 420 and 425.

For example, say that voltage VC is greater than voltage VD, so that node 425 has a greater voltage than node 420. For a period, both N3 and N4 sink current to ground when node 415 is taken to ground. Because the gate to source voltage $V_{GS}$ of N3 (voltage of node 425) is greater than the $V_{GS}$ of N4 (node 420), relatively more current flows from node 420 through the channel of N3 to ground. As a result, a quicker voltage drop occurs on node 420 than on node 425. Thus, the voltage of node 420 will decrease to a voltage level where N4 cuts off, so that current is no longer sunk from node 425 through N4 to ground. The voltage of node 425 stabilizes temporarily. As the voltage on node 420 continues to decrease to a sufficiently low level, P5 turns on and couples VC with node 425. Accordingly, the drive signal VC_DRIVE goes to voltage level VC, which can correspond to a logic "high" level of the drive signal. Contemporaneously, the $V_{GS}$ of N3 having been increased to VC causes more current to flow from node 420 to ground. The drive signal VD_DRIVE thus goes to ground (e.g., a logic "low" level). Collectively, the drive signals VC_DRIVE and VD_DRIVE indicate that the power supply VC has a greater voltage than VD.

On the next rising edge of PULSE, N2 is again cutoff, and P3 and P6 conduct to pre-charge nodes 425, 420 to respective voltage levels VC and VD. The process described above generally repeats.

Figure 5:
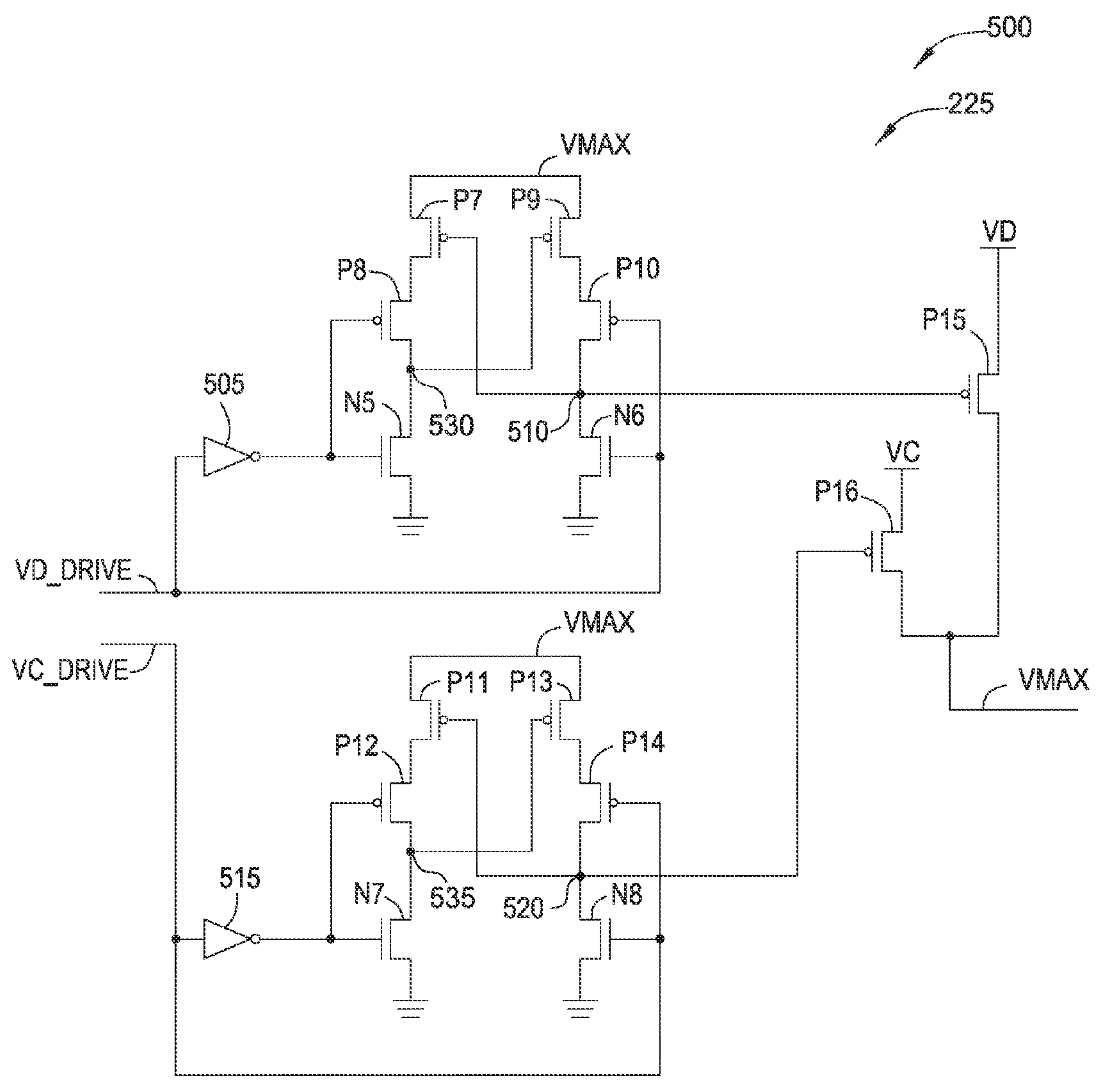
FIG. 5 is a schematic diagram of an exemplary voltage drive module, according to one embodiment.

FIG. 5 is a schematic diagram of an exemplary voltage drive module, according to one embodiment. Voltage drive module 500 provides one possible implementation of the voltage drive module 225. However, other implementations are possible.

The voltage drive module 500 includes a plurality of PFETs P7-P16 and a plurality of NFETs N5-N8. The voltage drive module 500 receives drive signals VC_DRIVE and VD_DRIVE. Continuing the earlier example in which VC is greater than VD, VC_DRIVE is driven "high" to voltage level VC while VD_DRIVE is driven "low" to ground. VC_DRIVE switches on N8 and switches off P14. The channel of N8 couples the gates of P11 and P16 to ground. P16 is switched on, coupling the voltage VC with the maximum voltage VMAX. The VMAX voltage value can be output to an attached device, such as a memory.

Although the connections are not shown, VMAX is also provided as a source voltage for P7, P9, P11, and P13. P11 is switched on responsive to N8 being switched on, coupling VMAX with the source of P12. Because an inverted VC_DRIVE drive signal is output form inverter 515, a logic "low" is provided to the gates of P12 and N7. P12 is switched on and VMAX is coupled with node 535. Thus, P13 is fully switched off.

VD_DRIVE, which is at a logical "low" in this example, turns off N6 and turns on P10. The inverted VD_DRIVE signal output from the inverter 505 (at a logical "high") turns off P8 and turns on N5. N5 conducts the gate of P9 to ground, switching on P9 and conducting current from VMAX, through the channels of P9 and P10, onto node 510. The voltage of node 510 increases to VMAX, so that P15 is switched off, keeping VD (the lesser voltage) disconnected from the VMAX node. Although the single example has been provided (where voltage VC is greater than VD), the person of ordinary skill will understand that the voltage drive module 500 will operate in a similar way to connect VD to the VMAX node when voltage VD is greater than VC.

Figure 6:
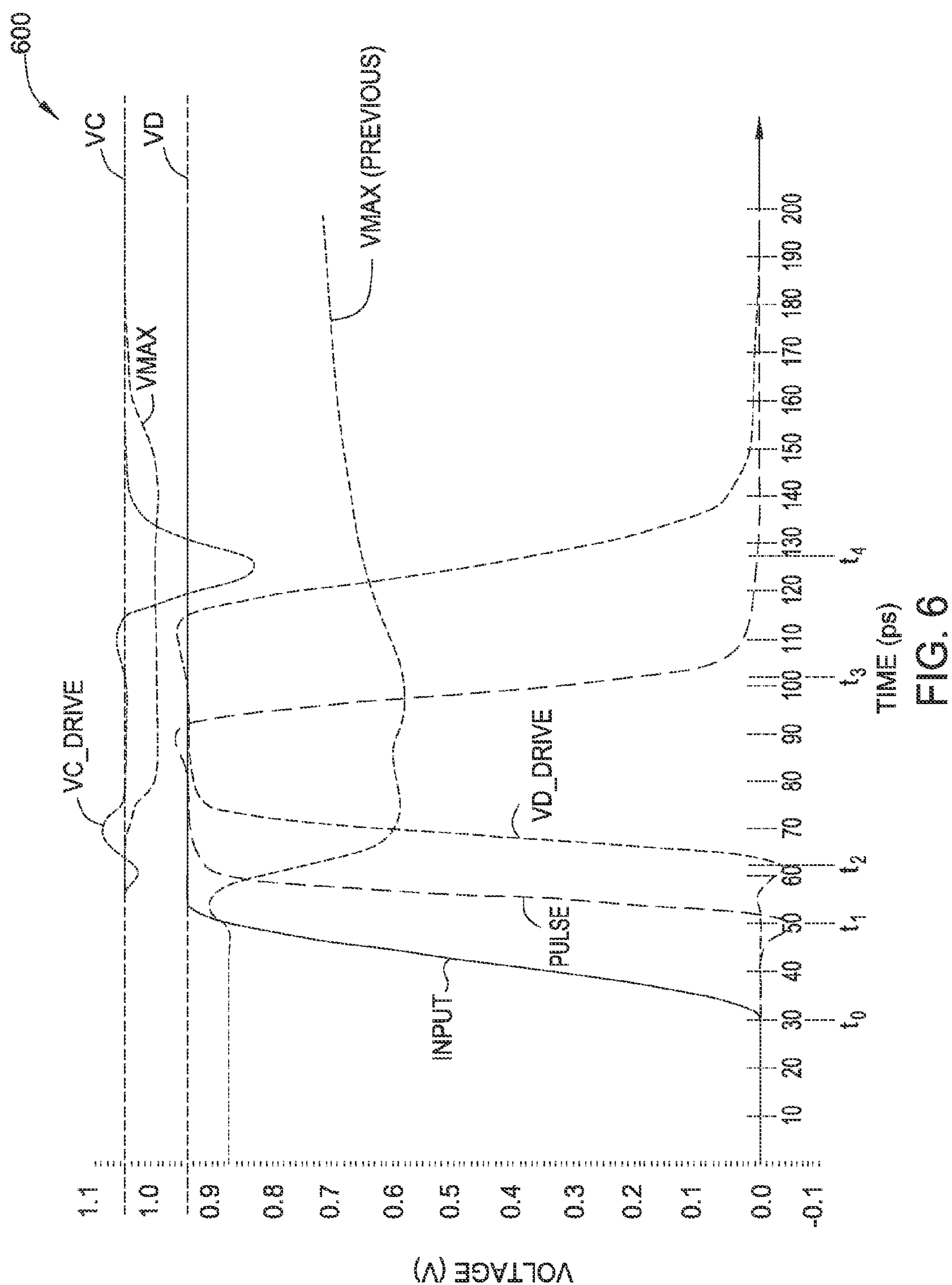
FIGS. 6 and 7 each include a plot illustrating the operation of an exemplary voltage detection circuit, according to one embodiment.
Figure 7:
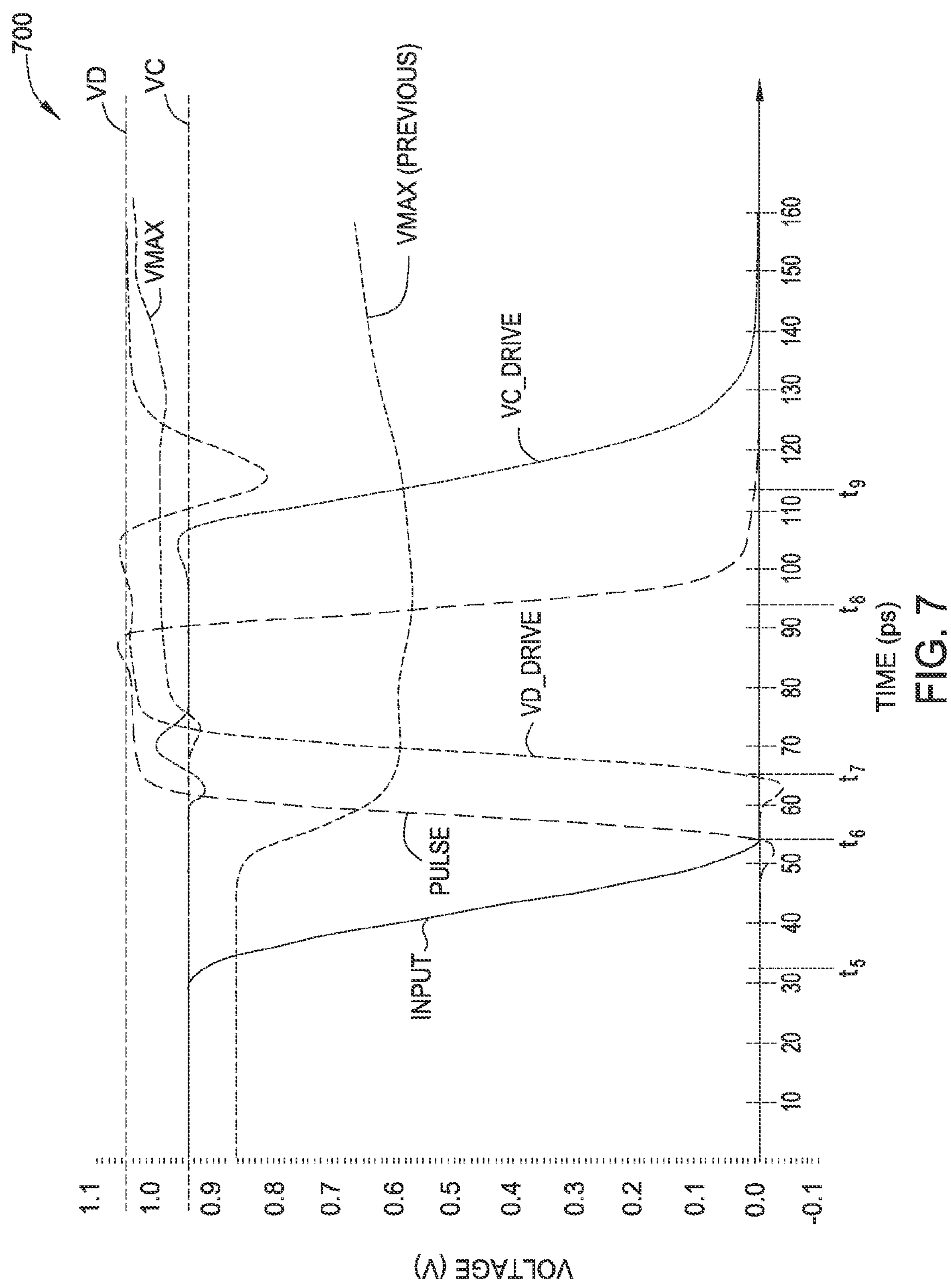

FIGS. 6 and 7 each include a plot illustrating the operation of an exemplary voltage detection circuit, according to one embodiment. The vertical axis of plot 600 depicts voltage in volts (V), while the horizontal axis depicts time in picoseconds ($10^{-12}$ s, or ps). Other voltage and time scales are possible, consistent with the selected technology (e.g., MOSFET) and properties of the particular switching devices (e.g., PFETs, NFETs) and properties of the input signals.

Voltage level VC is depicted as greater than voltage level VD (e.g., about 1.05 V compared with about 0.95 V). Thus, the sense amplifier module will generally cause VMAX to follow VC on plot 600. Prior to time $t_0$, VMAX and VC_DRIVE signals are approximately at the VC level, and the VD_DRIVE signal is approximately at ground, indicating that VC was greater than VD during the previous measurement. At time $t_0$ (about 30 ps), input signal "INPUT" begins a rising edge transition. Responsive to the rising edge of INPUT, the pulse generation module at time $t_1$ (about 50 ps) transitions the pulse signal "PULSE" high. As discussed above, the rising edge of PULSE causes the output nodes of the sense amplifier to pre-charge to respective VC and VD levels. The pre-charging is reflected in the VC_DRIVE and VD_DRIVE signals—which are produced on the output nodes—and pre-charging begins at time $t_2$ (about 60 ps). As VC_DRIVE is already substantially at the voltage level VC, the voltage increase from pre-charging is significantly more pronounced for VD_DRIVE. The VMAX voltage is slightly reduced from the initial VC value, and generally remains between VC and VD while the determination of the greater voltage is performed.

At time $t_3$ (about 100 ps), PULSE transitions low. As discussed above, the falling edge of PULSE causes the output nodes to be connected to ground and the node voltages to decrease. Between times $t_3$ and $t_4$, the VC_DRIVE and VD_DRIVE drive signals decrease from their pre-charged voltages VC, VD. However, because VC is greater than VD, the voltage of VD_DRIVE decreases more quickly than that of VC_DRIVE. At time $t_4$, the output node voltage indicated by VD_DRIVE is sufficiently low that the path for current from the other output node to ground is switched off. Therefore, VC_DRIVE reaches a minimum at time $t_4$. Next, the decrease in output node voltage (VD-_DRIVE) causes a switch to connect VC with the other output node, causing VC_DRIVE to begin increasing at time $t_4$. Generally, at about time $t_4$, the relative maximum voltage between VC and VD is determined. As VC_DRIVE continues to increase to VC and VD_DRIVE continues to decrease to ground, the VMAX voltage signal will approach VC. A maximum voltage determination performed by a previous implementation of voltage detection circuitry (VMAX (PREVIOUS)) is depicted for comparison. VMAX (PREVIOUS) tracks with the greater voltage VC, but is separated from VC by a threshold voltage drop of about 250 millivolts (mV). In some cases, the VMAX signal may track the greater voltage more quickly than the VMAX (PREVIOUS) signal. As discussed above, the voltage source providing the largest voltage level (whether VC or VD) is operated at or close to a "fully on" state (e.g., within a saturation region for the corresponding transistor). Operating the voltage sources at a "fully on" state results in a much lower impedance and improved responsiveness to any changes in current demands.

FIG. 7 illustrates plot 700, which generally represents a period of time following the period depicted in plot 600. In plot 700, the power supply voltage levels have changed, such that VD (1.05 V) is now greater than VC (0.95 V). Although both voltage levels VC and VD have been changed, in some cases one of the voltage levels may remain substantially constant while the other voltage level changes. Further, even though VC is no longer the greater voltage, the VMAX signal continues to track the voltage level VC until the next measurement of the power supplies occurs. Thus, although the transition of voltage levels VC and VD is not depicted, in plot 700 VMAX begins at the lower voltage level VC.

At time $t_5$, the input signal INPUT begins a falling edge transition. At time $t_6$, and responsive to the falling edge of INPUT, the pulse generator causes a rising edge to the PULSE signal, causing the output nodes to be pre-charged to respective voltages VC and VD. As VD was less than VC during the previous measurement, VD_DRIVE begins in plot 700 at ground and begins rising at time $t_7$ as the output nodes are pre-charging. Because VC was the greater voltage during the previous measurement, the corresponding output node requires less pre-charging to reach VC.

A falling edge of PULSE occurs at time $t_8$, causing the output nodes to be connected to ground and the output node voltages to decrease. In this case, because VC is the lesser voltage, the voltage on the output node corresponding to VC_DRIVE decreases more quickly than the voltage on the other output node (VD_DRIVE), causing a switch to disconnect the other output node from ground and halting the decrease of VD_DRIVE at time $t_9$. Next, the decrease in VC_DRIVE causes a switch to connect VD with the other output node, causing VD_DRIVE to begin increasing at time $t_9$ until reaching voltage level VD. The maximum voltage VMAX initially tracked VC then had an intermediate voltage between VC and VD while the determination of the larger voltage was made. As VD_DRIVE continues to increase to VD after time $t_9$ and VC_DRIVE continues to decrease to ground, the VMAX voltage signal will approach VD. VMAX (PREVIOUS) is depicted for comparison, and again is separated from the VD voltage by a threshold voltage drop.

Figure 8:
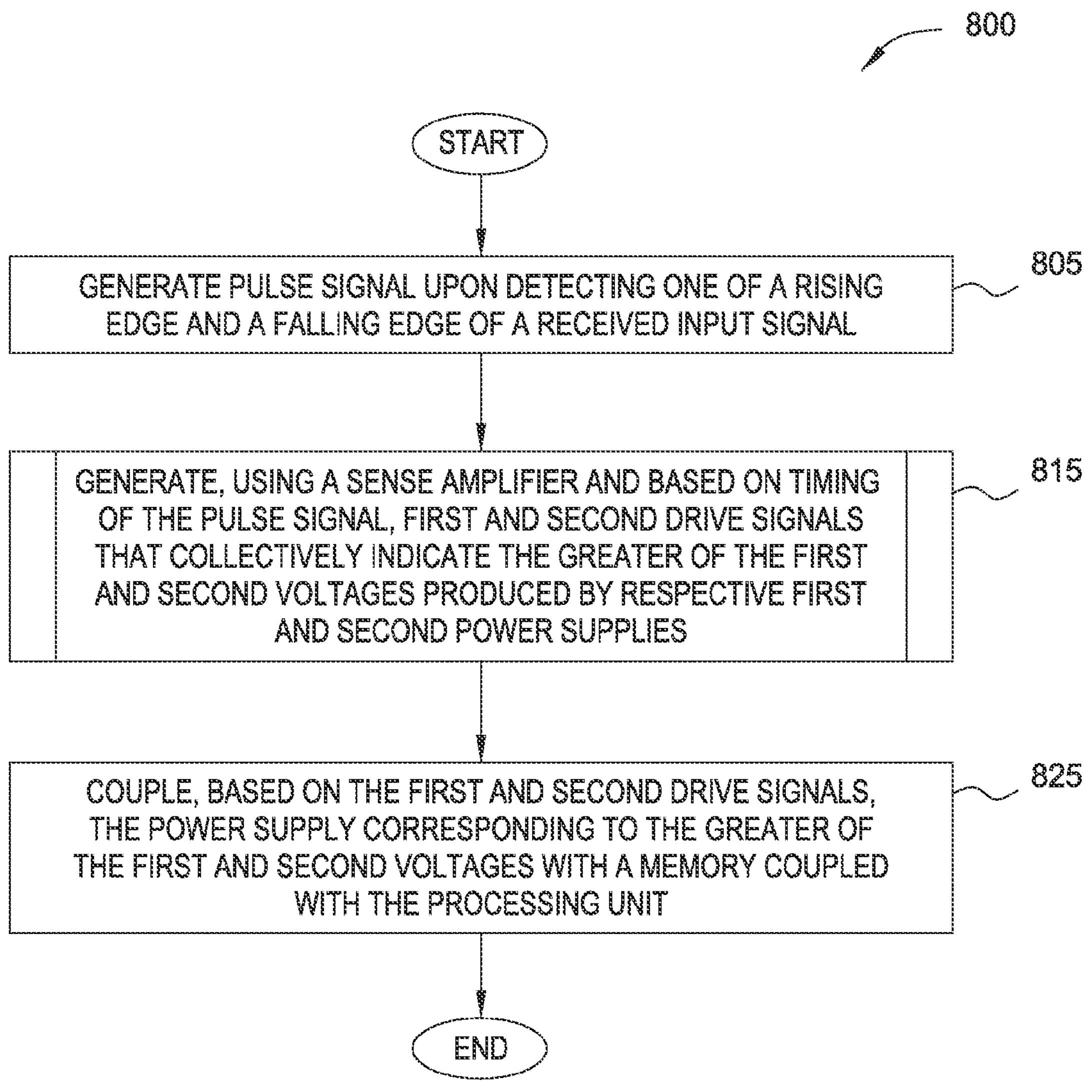
FIG. 8 is a block diagram illustrating a method of operating a processing unit to perform testing of a coupled memory, according to one embodiment.

FIG. 8 is a block diagram illustrating a method of operating a processing unit to perform testing of a coupled memory, according to one embodiment. Generally, method 800 may be performed for testing a memory with a selected power supply, the selected power supply having a highest relative voltage.

Method 800 begins at block 805, where the processing unit generates a pulse signal upon detecting one of a rising edge and a falling edge of a received input signal. At block 815, a sense amplifier of the processing unit generates first and second drive signals that are based on the timing of the pulse signal. The first and second drive signals collectively indicate the greater of first and second voltages that are produced by respective first and second power supplies that are coupled with the processing unit. At block 825, and based on the generated first and second drive signals, the processing unit couples the power supply corresponding to the indicated greater voltage of the first and second voltages with a coupled memory device. Method 800 ends following completion of block 825.

Figure 9:
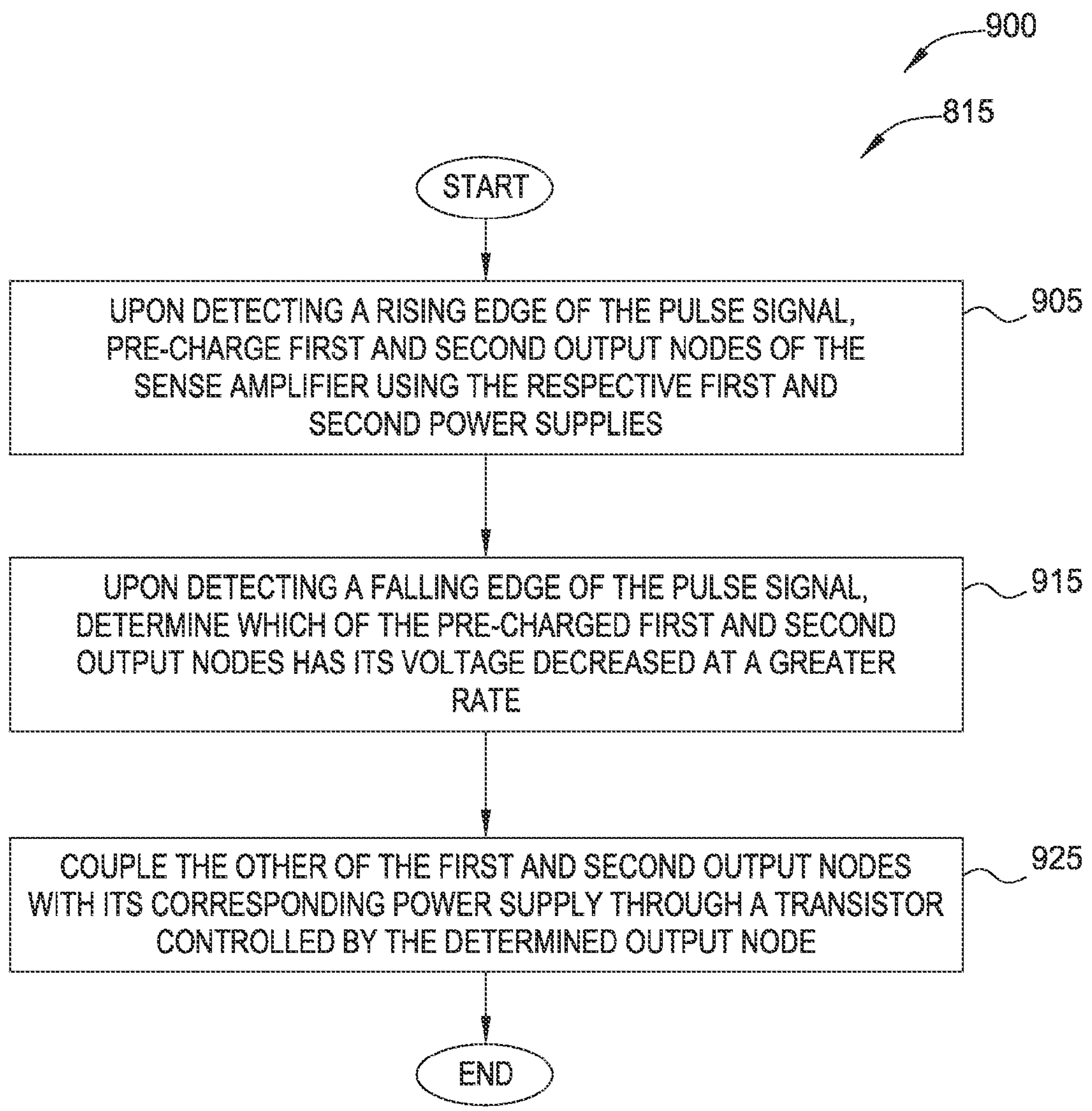
FIG. 9 is a block diagram illustrating a method of generating first and second drive signals based on timing of a received pulse signal, according to one embodiment.

FIG. 9 is a block diagram illustrating a method of generating first and second drive signals based on timing of a received pulse signal, according to one embodiment. Method 900 may be performed by a sense amplifier as part of block 815 of method 800, described above. Method 900 begins at block 905, where upon detecting a rising edge of the pulse signal, the sense amplifier pre-charges first and second output nodes using the respective first and second power supplies. In some embodiments, the pulse signal is used to control switches that couple the output nodes with the respective power supplies. In some cases, the output nodes are pre-charged to the voltage levels provided by the power supplies. However, in other cases the output nodes may be pre-charged to a portion of the power supplies' voltage levels.

At block 915, and upon detecting a falling edge of the pulse signal, the sense amplifier determines which of the pre-charged first and second output nodes has its voltage decreased at a greater rate. In some embodiments, each of the output nodes controls a respective switch that selectively couples the respective other of the output nodes with ground or with another suitable predetermined voltage. In some embodiments, the falling edge of the pulse signal controls a separate switch providing a path to ground for each of the respective switches. A greater voltage occurring on one of the output nodes may thus cause relatively more current to flow from the other output node to ground, decreasing the other output node's voltage more quickly than the output node having the greater voltage.

At block 925, the sense amplifier couples the other of the first and second output nodes with its corresponding power supply through a switch controlled by the determined output node. Method 900 ends following completion of block 925.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A computing system, comprising:

a memory; and a processing unit configured to perform testing of the memory using a selected one of at least first and second power supplies producing respective first and second voltages, the processing unit comprising:

a sense amplifier circuit configured to generate first and second drive signals corresponding to the respective first and second power supplies and indicating which of the first and second voltages is greater; and a voltage drive circuit configured to receive the first and second drive signals and to drive the relatively greater voltage of the first and second voltages onto an output coupled with the memory.

2. The computing system of claim 1, wherein the processing unit further comprises a pulse generation circuit, and wherein the sense amplifier circuit is configured to generate the first and second drive signals based on timing of a pulse signal received from the pulse generation circuit.

3. The computing system of claim 2, wherein the sense amplifier circuit is further configured to:

upon detecting a rising edge of the pulse signal, pre-charge first and second output nodes of the sense amplifier using the respective first and second power supplies; and upon detecting a falling edge of the pulse signal, determine which of the pre-charged first and second output nodes has its voltage decreased at a greater rate, wherein the determined output node is coupled with a gate of a transistor and is configured to couple the other of the first and second output nodes with its corresponding power supply through a channel of the transistor.

4. The computing system of claim 1, wherein the sense amplifier circuit is configured to:

couple the drive signal corresponding to the power supply producing a relatively lesser voltage of the first and second voltages with ground.

5. The computing system of claim 4, wherein the sense amplifier circuit is further configured to:

couple the drive signal corresponding to the power supply producing the relatively greater voltage with the relatively greater voltage.

6. The computing system of claim 1, wherein the voltage drive circuit comprises first and second output transistors configured to couple the respective first and second power supplies with the output, wherein gates of the output transistors are controlled by the respective first and second drive signals.

7. The computing system of claim 6, wherein the drive signal corresponding to the power supply producing the relatively greater voltage is provided to a gate of a transistor, and wherein the drive signal operates the transistor to couple the gate of the corresponding output transistor with ground, thereby driving the relatively greater voltage onto the output coupled with the memory.

8. A processing unit configured to receive first and second voltages from respective first and second power supplies, and to drive a relatively greater voltage of the first and second voltages onto an output, the processing unit comprising:

a sense amplifier circuit configured to generate first and second drive signals corresponding to the respective first and second power supplies and indicating which of the first and second voltages is greater; and a voltage drive circuit configured to receive the first and second drive signals and to drive the relatively greater voltage of the first and second voltages onto the output.

9. The processing unit of claim 8, further comprising a pulse generation circuit, wherein the sense amplifier circuit is configured to generate the first and second drive signals based on timing of a pulse signal received from the pulse generation circuit.

10. The processing unit of claim 9, wherein the sense amplifier circuit is further configured to:

upon detecting a rising edge of the pulse signal, pre-charge first and second output nodes of the sense amplifier with the respective first and second power supplies; and upon detecting a falling edge of the pulse signal, determine which of the pre-charged first and second output nodes has its voltage decreased at a greater rate, wherein the determined output node is coupled with a gate of a transistor and is configured to couple the other of the first and second output nodes with its corresponding power supply through a channel of the transistor.

11. The processing unit of claim 8, wherein the sense amplifier circuit is configured to:

couple the drive signal corresponding to the power supply producing a relatively lesser voltage of the first and second voltages with ground.

12. The processing unit of claim 11, wherein the sense amplifier circuit is further configured to:

couple the drive signal corresponding to the power supply producing the relatively greater voltage with the relatively greater voltage.

13. The processing unit of claim 8, wherein the voltage drive circuit comprises first and second output transistors configured to couple the respective first and second power supplies with the output, wherein gates of the output transistors are controlled by the respective first and second drive signals.

14. The processing unit of claim 13, wherein the drive signal corresponding to the power supply producing the relatively greater voltage is provided to a gate of a transistor, and wherein the drive signal operates the transistor to couple the gate of the corresponding output transistor with ground, thereby driving the relatively greater voltage onto the output.

15. A method of operating a processing unit coupled with first and second power supplies producing respective first and second voltages, the method comprising:

generating, using a sense amplifier of the processing unit and based on a timing of a received pulse signal, first and second drive signals that collectively indicate which of the first and second voltages is greater; and coupling, based on the first and second drive signals, the power supply corresponding to the relatively greater voltage of the first and second voltages with an output of the processing unit.

16. The method of claim 15, further comprising:

generating, using a pulse generation circuit of the processing unit, the pulse signal upon detecting one of a rising edge and a falling edge of a received input signal.

17. The method of claim 15, wherein generating the first and second drive signals based on the timing of the received pulse signal comprises:

upon detecting a rising edge of the pulse signal, pre-charging first and second output nodes of the sense amplifier using the respective first and second power supplies; and upon detecting a falling edge of the pulse signal, determining which of the pre-charged first and second output nodes has its voltage decreased at a greater rate, coupling the other of the first and second output nodes with its corresponding power supply through a transistor controlled by the determined output node.

18. The method of claim 15, wherein generating the first and second drive signals comprises coupling the drive signal corresponding to the power supply producing a relatively lesser voltage of the first and second voltages with ground.

19. The method of claim 18, wherein generating the first and second drive signals further comprises coupling the drive signal corresponding to the power supply producing the relatively greater voltage with the relatively greater voltage.

20. The method of claim 15, wherein the first and second power supplies are selectively coupled with the output of the processing unit through respective first and second output transistors, wherein gates of the output transistors are controlled by the respective first and second drive signals.

* * * * *